United States Patent [19]

Zyung et al.

[11] Patent Number: 5,604,398
[45] Date of Patent: Feb. 18, 1997

[54] ELECTROLUMINESCENCE LIGHT-EMITTING DEVICE WITH MULTI-LAYER LIGHT-EMITTING STRUCTURE

[75] Inventors: Tae-Hyoung Zyung; Jang-Joo Kim; Wol-Yon Hwang, all of Daejeon, Rep. of Korea

[73] Assignee: Electronics and Telecommunications Research Institute, Daejeon-shi, Rep. of Korea

[21] Appl. No.: 359,185

[22] Filed: Dec. 19, 1994

[30] Foreign Application Priority Data

Sep. 16, 1994 [KR] Rep. of Korea .................. 94-23652

[51] Int. Cl.$^6$ .............. H01J 1/62; H05B 33/12; H05B 33/14
[52] U.S. Cl. .............. 313/506; 313/503; 313/509
[58] Field of Search .................. 313/503, 506, 313/509

[56] References Cited

U.S. PATENT DOCUMENTS

| | | | |
|---|---|---|---|
| 3,153,166 | 10/1964 | Thornton | 313/506 |
| 3,299,307 | 1/1967 | Inoue | 313/506 |
| 4,137,481 | 1/1979 | Hilsum | 313/506 |
| 4,396,864 | 8/1983 | Suntola | 313/506 |
| 4,603,280 | 7/1986 | Pankove | 313/506 |
| 4,672,265 | 6/1987 | Eguchi | 313/506 |
| 4,689,522 | 8/1987 | Robertson | 313/506 |
| 5,382,477 | 1/1995 | Saito | 313/503 |
| 5,405,710 | 4/1995 | Dodabalapur | 313/503 |

OTHER PUBLICATIONS

Chemical Physics Letters, vol. 200, No. 1.2, Nov. 1992, pp. 46–54, entitled "Electroluminescence from multilayer conjugated polymer devices: spatial control of exciton formation and emissions" by A. R. Brown et al.

Jpn. J. Appl. Phys., vol. 33 (1994), pp. L1228–L1231, Part 2, No. 9A, 1 Sep. 1994, entitled "Novel Optical and Electroluminescent Characteristics in Organic Superlattice Structure Utilizing Cyclopentadiene Derivative and Aromatic Diamine" by Chikayoshi Morishima et al.

*Primary Examiner*—Louis M. Arana
*Assistant Examiner*—John Ning
*Attorney, Agent, or Firm*—Antonelli, Terry, Stout & Kraus, LLP

[57] ABSTRACT

Disclosed is an electroluminescence light-emitting device for generating an optical wavelength, comprises a substrate; an ITO layer coated on the substrate, at lest two light-emitting layers sequentially formed on the ITO layer and having a different band gap, and a metal electrode formed on an upper light-emitting layer of the at least two light-emitting layers, wherein the ITO layer is used as an anode and the metal electrode is used as a cathode.

1 Claim, 4 Drawing Sheets

ELECTROLUMINESCENCE LIGHT-EMITTING DEVICE WITH MULTI-LAYER LIGHT-EMITTING STRUCTURE

BACKGROUND OF THE INVENTION

1. Field of the Invention

The present invention relates to an electroluminescence light emitting device with a multi-layer light-emitting structure for producing produce a new optical wavelength.

2. Description of the Prior Art

Recently, there have been new attempts to fabricate electroluminescent devices using an organic material. Since an organic material is easy to work and synthesize in comparison to an inorganic material, several colors may be reduced.

Specifically, as a large-scale flat display, which is impossible to be fabricated by the inorganic material, is required, study to discover an organic electroluminescence light emitting device has rapidly increased.

Generally, in such an electroluminescence light emitting device fabricated using an organic conjugated polymer or an organic dyes, shifting of wavelength is determined mainly by selection of a material. For instance, the wavelength of a material itself constituting a light-emitting layer is distinguished, whereby a desired wavelength can be obtained.

Recently, it has been disclosed that the wavelength of emitted light is controlled by adjustment of a conjugation length of a conjugated polymer in the chemical structure of a light-emitting material.

In this method, however, it is difficult to adjust a conjugation length of a conjugated polymer. It is also difficult to compose a new material capable of obtaining a desired wavelength. Therefore, the method is limited to practical use.

SUMMARY OF THE INVENTION

It is an object of the present invention to provide an electroluminescence light emitting device in which at least two light-emitting layers having a different band gap are laminated to provide a new wavelength from the device.

According to the present invention, the electroluminescence light-emitting device for generating an optical wavelength, comprises a substrate; an ITO layer coated on the substrate, at least two light-emitting layers sequentially formed on the ITO layer and having a different band gap, and a metal electrode formed on an upper light-emitting layer of the at least two light-emitting layers, wherein the ITO layer is used as an anode and the metal electrode is used as a cathode.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1:
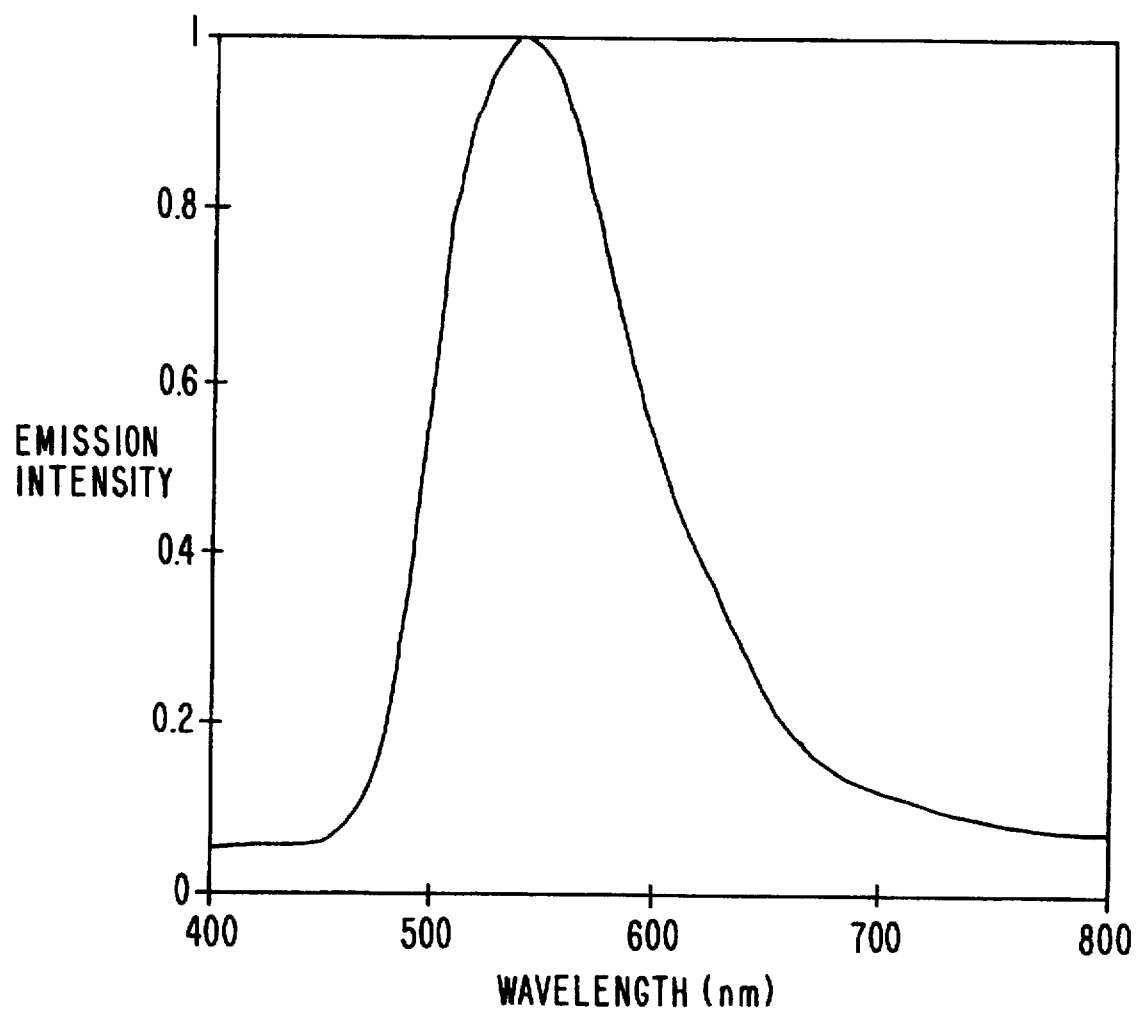
FIG. 1 is an electroluminescence light emitting spectrum showing the relation between wavelength and emission intensity in a single light-emitting layer having a first band gap in the prior art.

Referring to FIG. 1, in the case when a light-emitting layer is composed of a first single light-emitting layer having a first band gap, the relationship between wavelength and emission intensity is shown. By the electroluminescence light emitting spectrum of FIG. 1, the first single light-emitting layer has a light-emitting wavelength of around 530 nm (i.e. 5300 Å) and its light-emitting color is green.

Figure 2:
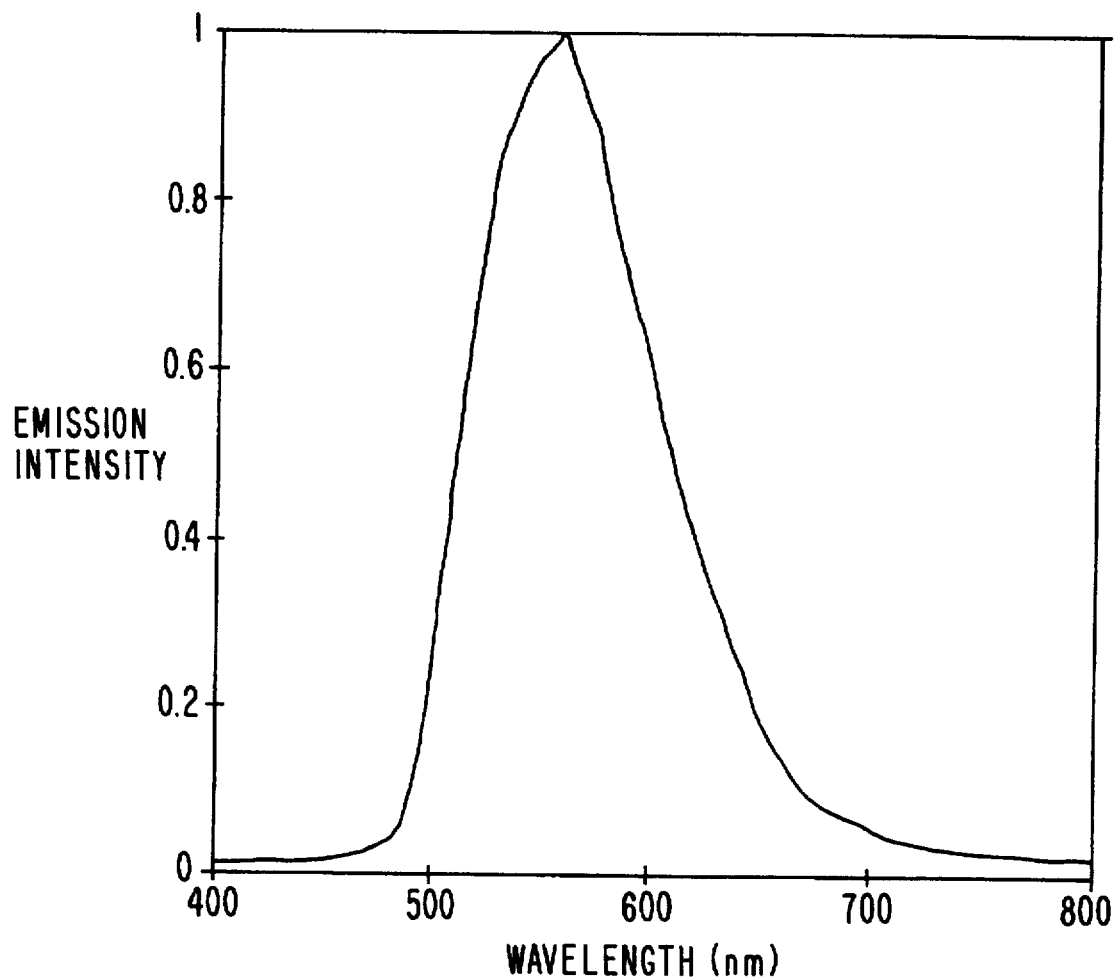
FIG. 2 is an electroluminescence light emitting spectrum showing the relation between wavelength and emission intensity in another single light-emitting layer having a second band gap different from the first band gap in the prior art.

In FIG. 2, in the case when a light-emitting layer is composed of a second single light-emitting layer having a second band gap different from the first band gap, the relationship between wavelength and emission intensity thereof is shown. By the electroluminescence light emitting spectrum of FIG. 2, the second single light-emitting layer has a light-emitting wavelength of around 560 nm and its light-emitting color is yellow. Also, it can be seen from FIGS. 1 and 2 that the band gap of the second single light-emitting layer is less than that of the first single light-emitting layer.

The electroluminescence light emitting device having two light-emitting layers having a different band gap is fabricated by using the following fabrication method.

Figure 3:
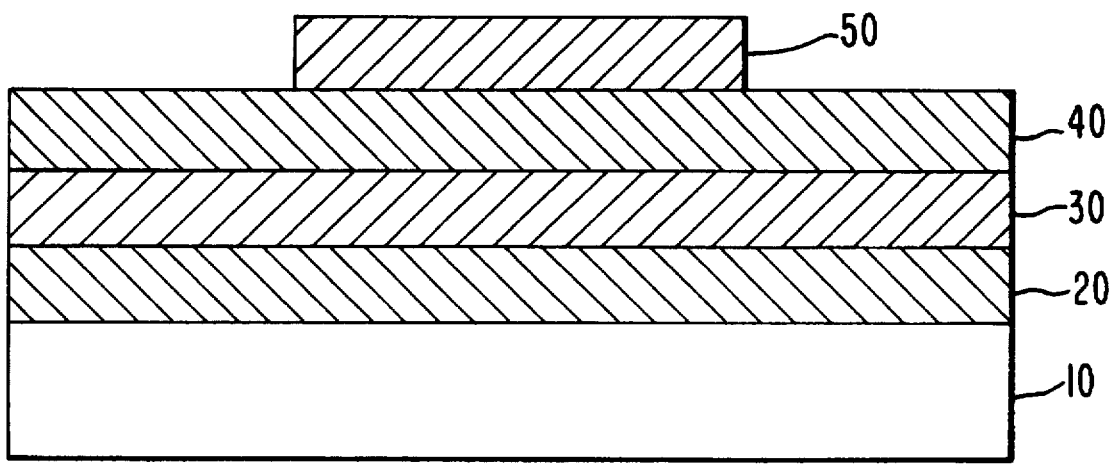
FIG. 3 is a cross-sectional view showing the construction of an electroluminescence light emitting device in which two light-emitting layers having a different band gap are laminated on an indium tin oxide layer in accordance with the present invention.

With reference to FIG. 3, first, an ITO (indium tin oxide) layer 20 is coated on a substrate 10, and then first and second light-emitting layers 30, 40 are sequentially formed on the ITO layer 20 by spin-coating. Next, a metal electrode 90 is formed on the second light-emitting layers 40.

A band gap of the first organic polymer light-emitting layer 30 is different from that of the second organic polymer light-emitting layer 40. Each of the light-emitting layers 30, 40 is composed of an organic polymer.

Assume that the first light-emitting layer 30 has a characteristic of the electroluminescence spectrum shown in FIG. 1 and the second light-emitting layer 40 has a characteristic of the electroluminescence spectrum shown in FIG. 2.

In the device of FIG. 3, the metal electrode 50 is used as a cathode and the ITO layer 20 is used as an anode. If a voltage is applied to the device, a new optical wavelength is generated as shown in FIG. 4.

Figure 4:
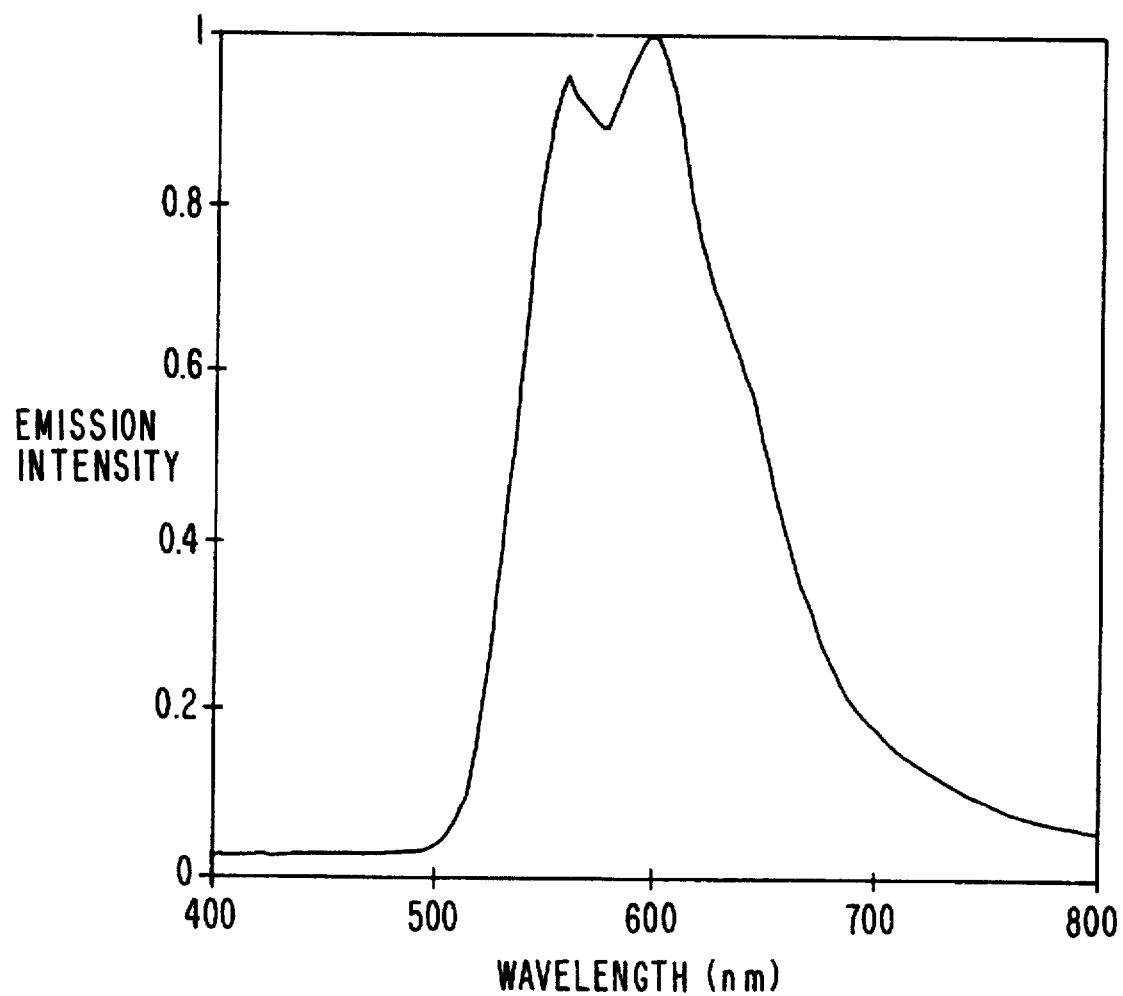
FIG. 4 is an electroluminescence spectrum showing a relation between the wavelength and emission intensity in the electroluminescence light emitting device of FIG. 3.

As can be seen from the electroluminescence spectrum of FIG. 4, the emission is shown around 600 nm and around 560 nm.

Also, it can be seen from FIG. 4, a new emission spectrum peak exists at a long wavelength. The new emission spectrum peak does not exist in the electroluminescence light-emitting device composed of a single light-emitting layer, as shown in FIGS. 1 and 2.

As described above, in accordance with the invention when two organic polymer light-emitting layers having different band gaps are laminated, injected electrons or holes are recombined at the interface between the two light-emitting layers 30 and 40. As a result, a new optical wavelength other than that of a single light-emitting layer itself is produced.

In the embodiment of FIG. 3, that the device has two light-emitting layers, but it is not limited to them. For instance, the device may have at least three light-emitting layers on an ITO layer.

As described above, by the electroluminescence light-emitting device having at least two light-emitting layers, a new optical wavelength can be obtained. Therefore, it is not necessary to compose a material having a new wavelength. Also, it is possible to minimize adjustment of a conjugation length of a conjugated polymer.

It is understood that various other modifications will be apparent to and can be readily made by those skilled in the art without departing from the scope and spirit of this invention.

While the invention has been described in terms of its preferred embodiments, it should be understood that numerous modifications may be made thereto without departing from the spirit and scope of the invention. It is intended that all such modifications fall within the scope of the appended claims.

What is claimed is:

1. An electroluminescence light-emitting device for generating an optical wavelength, the device comprising:

a substrate;

an ITO layer posed on the substrate;

at least one pair of opposed and contacting light-emitting layers creating an interface with each light-emitting layer emitting light of an optical wavelength different from each other light-emitting layer, each interface emitting light of an optical wavelength different from the light emitted from the light-emitting layers and the interface of any other pair of opposed light-emitting layers; and a metal electrode formed on an upper light-emitting layer of at least one pair of light-emitting layers; and wherein the ITO layer is an anode and the metal electrode is a cathode and each light-emitting layer is formed from an organic polymer.

\* \* \* \* \*